US010163988B2

United States Patent
Sun et al.

(10) Patent No.: US 10,163,988 B2
(45) Date of Patent: Dec. 25, 2018

(54) LIGHT-EMITTING APPARATUS, METHOD FOR FORMING LIGHT-EMITTING APPARATUS, AND DISPLAY APPARATUS

(71) Applicant: BOE TECHNOLOGY GROUP CO., LTD., Beijing (CN)

(72) Inventors: Jie Sun, Beijing (CN); Yanzhao Li, Beijing (CN); Chung-Chun Lee, Beijing (CN); Xiaoguang Xu, Beijing (CN); Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/528,422

(22) PCT Filed: May 25, 2016

(86) PCT No.: PCT/CN2016/083276
§ 371 (c)(1),
(2) Date: May 19, 2017

(87) PCT Pub. No.: WO2017/148022
PCT Pub. Date: Sep. 8, 2017

(65) Prior Publication Data
US 2018/0061911 A1    Mar. 1, 2018

(30) Foreign Application Priority Data

Feb. 29, 2016  (CN) .......................... 2016 1 0111792

(51) Int. Cl.
*H01L 27/32*   (2006.01)
*H01L 51/52*   (2006.01)
(Continued)

(52) U.S. Cl.
CPC .......... *H01L 27/3225* (2013.01); *C09K 11/06* (2013.01); *H01L 27/3202* (2013.01);
(Continued)

(58) Field of Classification Search
CPC ............. H01L 27/3209; H01L 27/3225; H01L 51/5278; H01L 51/5036; H01L 51/502
See application file for complete search history.

(56) References Cited

U.S. PATENT DOCUMENTS

2005/0236556 A1* 10/2005 Sargent ............... H01L 27/3227
                                                                   250/214.1
2008/0238299 A1* 10/2008 Cho .................... H01L 51/5278
                                                                   313/503
(Continued)

FOREIGN PATENT DOCUMENTS

CN       101937975 A     1/2011
CN       102255019 A     11/2011
(Continued)

OTHER PUBLICATIONS

First Chinese Office Action, for Chinese Patent Application No. 201610111792.9, dated Dec. 30, 2016, 13 pages.
(Continued)

*Primary Examiner* — Mariceli Santiago
(74) *Attorney, Agent, or Firm* — Kinney & Lange, P.A.

(57) ABSTRACT

The present invention provides a light-emitting apparatus, a method for forming a light-emitting apparatus, and a display apparatus. The light-emitting apparatus comprises at least one OLED light-emitting unit and at least one quantum dot light-emitting unit, wherein the at least one quantum dot light-emitting unit and the at least one OLED light-emitting unit are arranged in series.

9 Claims, 2 Drawing Sheets

(51) Int. Cl.
*C09K 11/06* (2006.01)
*H01L 33/06* (2010.01)
*H01L 51/50* (2006.01)
*H05B 33/14* (2006.01)

(52) U.S. Cl.
CPC .......... *H01L 27/3209* (2013.01); *H01L 33/06* (2013.01); *H01L 51/502* (2013.01); *H01L 51/5044* (2013.01); *H01L 51/5056* (2013.01); *H01L 51/5088* (2013.01); *H01L 51/5278* (2013.01); *H05B 33/14* (2013.01)

(56) References Cited

U.S. PATENT DOCUMENTS

| | | | | |
|---|---|---|---|---|
| 2010/0102294 A1* | 4/2010 | Jou | ...................... | H01L 51/5096 257/13 |
| 2010/0213438 A1* | 8/2010 | Cho | ...................... | H01L 51/5096 257/13 |
| 2011/0284819 A1* | 11/2011 | Kang | ...................... | H01L 51/502 257/9 |
| 2016/0005989 A1* | 1/2016 | Gu | ...................... | H01L 51/502 257/13 |
| 2016/0254474 A1* | 9/2016 | Zou | ...................... | H01L 51/502 257/40 |
| 2016/0336525 A1* | 11/2016 | Wu | ...................... | H01L 51/502 |

FOREIGN PATENT DOCUMENTS

| | | |
|---|---|---|
| CN | 102907176 A | 1/2013 |
| CN | 103500803 A | 1/2014 |
| CN | 104362255 A | 2/2015 |
| CN | 105514295 A | 4/2016 |
| KR | 20130015671 A | 2/2013 |
| WO | 2014088667 A2 | 6/2014 |
| WO | 2015002565 A1 | 1/2015 |

OTHER PUBLICATIONS

Second Chinese Office Action, for Chinese Patent Application No. 201610111792.9, dated Apr. 17, 2017, 12 pages.
International Search Report and Written Opinion (including English translation of Box V) for PCT Patent Application No. PCT/CN2016/083276, dated Nov. 30, 2016, 12 pages.
Third Chinese Office Action, for Chinese Patent Application No. 201610111792.9, dated Sep. 20, 2017, 12 pages.

* cited by examiner

LIGHT-EMITTING APPARATUS, METHOD FOR FORMING LIGHT-EMITTING APPARATUS, AND DISPLAY APPARATUS

TECHNICAL FIELD

The present disclosure relates to the field of display, and particularly to a light-emitting apparatus, a method for forming a light-emitting apparatus, and a display apparatus.

BACKGROUND ART

In recent years, organic light-emitting diode (OLED) light-emitting apparatuses have been rapidly developed due to the flexibility thereof. In order to obtain white light, a typical OLED light-emitting apparatus comprises a multi-layer structure. As shown in FIG. 4, an OLED light-emitting apparatus comprises three stacked OLED light-emitting units, and charge generation layers are provided between light-emitting units. However, the OLED light-emitting apparatus having this existing structure has a relatively high cost.

Further, the saturation of the light emitted by this OLED light-emitting apparatus needs to be further improved.

SUMMARY OF THE INVENTION

In view of this, an object of this disclosure is to provide a light-emitting apparatus and a method for preparing this light-emitting apparatus, and a part of problems or disadvantages in the prior art may be at least overcome.

According to an aspect of the invention, there is provided a light-emitting apparatus, comprising at least one OLED light-emitting unit and at least one quantum dot light-emitting unit, wherein the at least one quantum dot light-emitting unit and the at least one OLED light-emitting unit are arranged in series.

According to another aspect of the invention, there is provided a method for forming a light-emitting apparatus, comprising the steps of:

forming at least one OLED light-emitting unit on a substrate; and forming at least one quantum dot light-emitting unit on the at least one OLED light-emitting unit;

or forming at least one quantum dot light-emitting unit on a substrate; and forming at least one OLED light-emitting unit on the at least one quantum dot light-emitting unit;

wherein the at least one quantum dot light-emitting unit and the at least one OLED light-emitting unit are connected in series.

According to still another aspect of the invention, there is provided a display apparatus, comprising the light-emitting apparatus described above and the light-emitting apparatus prepared by the method described above.

DESCRIPTION OF EMBODIMENTS

Figure 1:
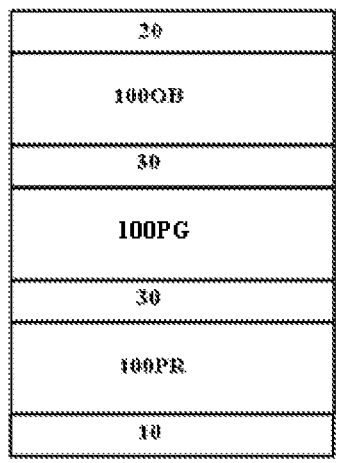
FIG. 1 shows a schematic diagram of a light-emitting apparatus according to one embodiment of the invention.

Reference will now be made in detail to embodiments of the invention, and the examples thereof are illustrated in accompanying drawings. In the drawings, the numbers represent the same elements. In order to explain the invention, the embodiments below will be described with reference to accompanying drawings.

According to one embodiment of the invention, there is provided a light-emitting apparatus, comprising at least one OLED light-emitting unit 100O and at least one quantum dot light-emitting unit 100P, wherein the at least one quantum dot light-emitting unit 100P and the at least one OLED light-emitting unit 100O are arranged in series.

A "quantum dot light-emitting unit" refers to a light-emitting unit comprising quantum dots, wherein the light-emitting material in this kind of light-emitting unit is in a granular form. For example, the size is several nanometers or more than ten nanometers, and may also be dozens of nanometers; and may also be on the order of micrometers. Some light-emitting material particles having a nanoscale size may be referred to as quantum dot light-emitting materials, while some light-emitting material particles having a corresponding size may be referred to as fluorescent light-emitting materials. When the size of particles is on the order of several nanometers to dozens of nanometers, such particles on the order of nanometers of the light-emitting material may emit light with a modified or changed wavelength due to the quantum effect brought about by the size. For example, the wavelength of the light emitted from particles of a nanoscale light-emitting material may be shorter than the wavelength of the light emitted from the bulk of the light-emitting material, due to the quantum confinement effect. The size of light-emitting material particles may be controlled by such an effect to adjust the wavelength of the emergent light of a light-emitting layer or light-emitting unit comprising the light-emitting material particles, so as to satisfy the design requirement. Further, since the wavelength of the emergent light of a quantum dot light-emitting layer may be adjusted, the light emitted from a light-emitting apparatus may be further adjusted. Light having a full chromaticity may be obtained by designing the wavelength of the emergent light of at least one OLED light-emitting unit 100O and the wavelength of the emergent light of at least one quantum dot light-emitting unit 100P.

Further, the light-emitting apparatus according to the invention is flexible and thus may be used in flexible light-emitting devices, lighting devices, and flexible display devices. For example, the light-emitting apparatus may have a flexible base.

In an embodiment of the invention, the at least one quantum dot light-emitting unit 100P may comprise any one or more of a red quantum dot light-emitting unit 100PR, a green quantum dot light-emitting unit 100PG, and a blue quantum dot light-emitting unit 100PB. These quantum dot light-emitting units 100P may be flexible. In order to obtain light having a higher brightness and a better saturation, in one embodiment of the invention, the light-emitting apparatus comprises a plurality of light-emitting units. These light-emitting units may comprise any one or more of a red quantum dot light-emitting unit 100PR, a green quantum dot light-emitting unit 100PG, and a blue quantum dot light-emitting unit 100PB, and meanwhile may further comprise any one or more of a green OLED light-emitting unit 100OG, a red OLED light-emitting unit 100OR, and a blue OLED light-emitting unit 100OB at the meanwhile. Selection may be made by a person skilled in the art according to practical needs. Furthermore, in a preferred embodiment, in order to obtain a relatively intense light-emitting intensity, a plurality of quantum dot light-emitting units and OLED light-emitting units may be provided. For example, 10 or more light-emitting units are provided in total. Preferably, these light-emitting units have the compatible characteristic of flexibility.

Each quantum dot light-emitting unit 100P may comprise a hole injection layer, a quantum dot light-emitting layer, and an electron injection layer. The hole injection layer and the electron injection layer are arranged on opposite side surfaces of the quantum dot light-emitting layer respectively.

FIG. 1 shows a light-emitting apparatus according to one embodiment of the invention, which comprises a blue OLED light-emitting unit 100OB, a green quantum dot light-emitting unit 100PG, and a red quantum dot light-emitting unit 100PR. In FIG. 1, the blue OLED light-emitting unit 100OB is connected to the green quantum dot light-emitting unit 100PG, and sequentially, the green quantum dot light-emitting unit 100PG is connected to the red quantum dot light-emitting unit 100PR. In another embodiment of the invention, the light-emitting apparatus may further comprise one or more other OLED light-emitting units 100O and other quantum dot light-emitting units 100P. The light-emitting apparatus may further comprise a charge generation layer 30. As shown in FIG. 1, a charge generation layer 30 may be provided between the blue OLED light-emitting unit 100OB and the green quantum dot light-emitting unit 100PG, and a charge generation layer 30 may be provided between the green quantum dot light-emitting unit 100PG and the red quantum dot light-emitting unit 100PR. A charge generation layer refers to a layer which generates carriers after the light-emitting apparatus is switched on, which are injected to the light-emitting layer, so as to generate light. The charge generation layer may generate electrons and/or holes. In an embodiment of the invention, the charge generation layer may be flexible. In one embodiment of the invention, the light-emitting apparatus further comprises a first electrode 10 and a second electrode 20, which are arranged on a first surface and a second surface opposite to the first surface of the light-emitting apparatus so as to achieve the electrical connection between the light-emitting apparatus and the exterior. In this specification, a first surface and a second surface may refer to two opposite surfaces of a light-emitting apparatus, for example, the upper surface and the lower surface of the apparatus in FIG. 1. In the embodiment of FIG. 1, a first electrode 10 is connected to a red quantum dot light-emitting unit 100PR, and a second electrode 20 is connected to a green quantum dot light-emitting unit 100PG. In another embodiment of the invention, the light-emitting apparatus may comprise a plurality of OLED light-emitting units 100O and a plurality of quantum dot light-emitting units 100P, which are connected in series as shown in FIG. 1. Preferably, the light-emitting apparatus is flexible.

In one embodiment of the invention, the quantum dot light-emitting unit 100P may further comprise a hole transport layer and an electron transport layer, wherein the hole transport layer is provided between the hole injection layer and the quantum dot light-emitting layer, and the electron transport layer is provided between the electron injection layer and the quantum dot light-emitting layer.

Figure 2:
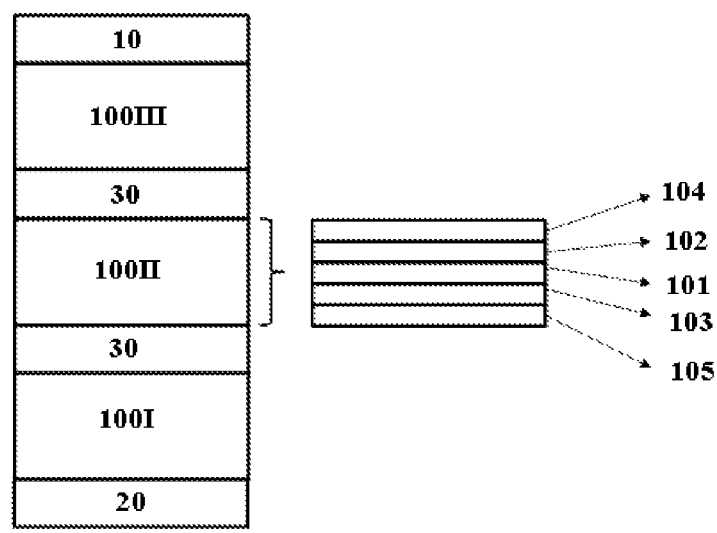
FIG. 2 shows a schematic diagram of a light-emitting apparatus according to one embodiment of the invention, wherein the specific structure of a second light-emitting unit is shown.

FIG. 2 shows a schematic diagram of a light-emitting apparatus according to one embodiment of the invention, wherein the structure of a second light-emitting unit 100II is shown at the right side of FIG. 2. In the embodiment as shown in FIG. 2, the light-emitting apparatus comprises a first light-emitting unit 100I, a second light-emitting unit 100II, and a third light-emitting unit 100III. The first light-emitting unit 100I, the second light-emitting unit 100II, and the third light-emitting unit 100III are all flexible. The first light-emitting unit 100I, the second light-emitting unit 100II, and the third light-emitting unit 100III may be OLED light-emitting units 100O, or may be a kind of quantum dot light-emitting units 100P. FIG. 2 shows the specific structure of one light-emitting unit of a plurality of light-emitting units, for example, the specific structure of a second light-emitting unit 100II. The second light-emitting unit 100II may be an OLED light-emitting unit 100O, or may be a quantum dot light-emitting unit 100P. In other words, the light-emitting layer 101 in FIG. 2 may be an OLED light-emitting layer, or may be a quantum dot light-emitting layer. As shown in FIG. 2, the second light-emitting unit 100II comprises an electron injection layer 104, an electron transport layer 102, a light-emitting layer 101, a hole transport layer 103, and a hole injection layer 105, which are stacked and arranged in this order. A charge generation layer 30 is provided between a first light-emitting unit and a second light-emitting unit. A charge generation layer 30 is provided between a second light-emitting unit and a third light-emitting unit. In another embodiment of the invention, the light-emitting apparatus may comprise more than three light-emitting units. These light-emitting units may be selected and configured as needed so as to emit light with a desirable wavelength and saturation. Charge generation layers are provided between these light-emitting units, and these light-emitting units are flexible, so that the light-emitting apparatus comprising these light-emitting units are flexible.

In an embodiment of the invention, an OLED light-emitting unit 100O may be formed by a solution coating process or an evaporation coating process. The material for forming a blue OLED light-emitting layer 101 may comprise one in Table 1.

TABLE 1

Materials for forming the blue OLED light-emitting layer

| Abbreviation | CAS No. | Name |
| --- | --- | --- |
| mCP | 550378-78-4 | 9,9'-(1,3-phenyl)bis-9H-carbazole |
| TCP | 148044-07-9 | 1,3,5-tris(9-carbazolyl)benzene |
| TCTA | 139092-78-7 | 4,4',4''-tris(carbazol-9-yl)triphenylamine |
| FIr6 | 664374-03-2 | (OC-6-33)-bis[3,5-difluoro-2-(2-pyridinyl-kN)phenyl-kC] [tetrakis(1H-pyrazolyl-kN1)borato(1-)-kN1,kN2']-iridium |

According to one embodiment of the invention, the quantum dot light-emitting unit 100P may comprise a quantum dot light-emitting layer 101, wherein the quantum dot light-emitting layer 101 comprises a close-packed structure of a plurality of quantum dots. In another embodiment of the invention, the quantum dot light-emitting layer 101 comprises quantum dots randomly distributed in the light-emitting layer 101. The quantum dot light-emitting layer is a flexible light-emitting layer.

According to one embodiment of the invention, the quantum dot light-emitting layer 101 is formed by coating a quantum dot solution onto a substrate and curing it. In other words, the quantum dot light-emitting layer 101 is formed after a quantum dot solution is coated onto a substrate and cured. For example, a quantum dot solution is first formed; and then the quantum dot light-emitting layer 101 is formed after a quantum dot solution is coated onto a substrate and cured. In the process of curing, a part of or the entire solvent may volatilize. This method forming a light-emitting layer 101 by coating a solution onto a substrate is advantageous, because the requirement for process conditions of forming a quantum dot light-emitting layer 101 by a solution process is low. Compared to a process of molecular beam epitaxy or vapor phase epitaxy, the solution process does not require high vacuum degree and cleanness, which is particularly advantageous in forming a quantum dot light-emitting unit 100P on an OLED light-emitting unit 100O, because a process of forming a quantum dot light-emitting unit 100P on an OLED light-emitting unit 100O by an epitaxial method typically requires a series of complicated pretreatments and process conditions such as a plurality of redundant cleaning steps, drying steps, etc., resulting in an extremely high cost in practical production. Moreover, it is particularly advantageous that the quantum dot light-emitting layer 101 formed by a solution process may be flexible; and the quantum dot light-emitting layer 101 may be prone to be configured with the layer of the OLED light-emitting unit in properties of materials, so that the light-emitting apparatus according to the invention is allowed to overall have a good flexibility. This is advantageous for some existing devices to satisfy the requirement for flexibility.

In one embodiment of the invention, the light-emitting apparatus comprises two quantum dot light-emitting units 100P, for example, a red quantum dot light-emitting unit 100PR and a green quantum dot light-emitting unit 100PG as shown in FIG. 1. According to this embodiment, when a red quantum dot light-emitting unit 100PR and a green quantum dot light-emitting unit 100PG are prepared, the solution for forming the red quantum dot light-emitting layer and the solution for forming the green quantum dot light-emitting layer are solutions which have different properties and are insoluble in each other, so that one material in each of the solutions for forming adjacent layers will not be dissolved in the other solution. Actually, each quantum dot light-emitting unit has a plurality of layers, and any two adjacent layers are formed by using solutions having different properties. That is, solutions for forming two adjacent layers in a quantum dot light-emitting unit are solutions which have different properties and are insoluble in each other, respectively. Particularly, an aqueous solvent may be used to form an aqueous green quantum dot solution, and this solution is then coated on an OLED light-emitting unit or a substrate to form a green quantum dot light-emitting layer after curing; and thereafter, an oily solution is used on this green quantum dot light-emitting layer to form, for example, an electron transport layer or a hole transport layer. It can be known according to the disclosure that an aqueous solution is used, after an electron or hole transport layer is formed, to correspondingly form an electron injection layer or a hole injection layer. Here, the meaning of "adjacent" may include two layers which directly abut on each other. However, "adjacent" may include other cases. For example, when two different layers are produced by using a solution process, one or more layers may be formed between these two layers by using an evaporation coating process or another process, and the two layers formed by using a solution process are still two adjacent layers.

According to this concept of the invention, a solution with a suitable property may be selected when a first layer of a light-emitting unit is formed on a substrate for the first time, and subsequently a solution with a different property may be selected to form a second layer on this first layer. Cross contamination between adjacent layers may be prevented by alternately forming two adjacent layers by using solutions with different properties.

In one embodiment of the invention, for example, the electron injection layer and the electron transport layer may be formed by using solutions with the same property, and for example, are all formed by using an aqueous solution; subsequently, the light-emitting layer adjacent to the electron transport layer is formed by using an oily solution. The adjacent hole transport layer on the other side of the light-emitting layer may be formed by using an aqueous solution.

In one embodiment of the invention, an oily solution may be used to form an oily red quantum dot solution. Since the oily red quantum dot solution is not dissolved in the aqueous solution previously used, the substances in the aqueous solution previously used will not be dissolved in an oily red quantum dot solution subsequently used, so as to prevent the contamination brought about by mutual dissolution of solutes in two solutions.

In another embodiment of the invention, the light-emitting apparatus may comprise a plurality of quantum dot light-emitting units. When two connected (adjacent) light-emitting units comprising quantum dots of different light-emitting materials are prepared, the solution for forming the first quantum dot light-emitting layer and the solution for forming the second quantum dot light-emitting layer may be solutions which have different properties and are insoluble in each other, so that one material in each of the solutions for forming adjacent layers will not be dissolved in another solution so as to prevent the contamination brought about by mutual dissolution of solutes in two solutions. Otherwise, the solution for forming the first quantum dot light-emitting layer and the solution for forming an adjacent electron transport layer or hole transport layer have different properties and will not be dissolved in each other, so as to prevent the contamination brought about by mutual dissolution of solutes in two solutions.

Quantum dot solutions for forming light of various colors may also be directly commercially purchased, and for example, the aqueous quantum dot solution may be purchased from Suzhou Xingshuo Nanotech Co., Ltd. (Mesolight) of Suzhou Industrial Park, China (through the website of http://www.mesolight.cc/list-27.html) and the oily quantum dot solution may be purchased from Guangdong Poly OptoElectronics Co., Ltd. of Jiangmen City, Guangdong Province, China (through the website of http://polyoe.com/index.html).

After a quantum dot solution is coated onto a substrate or onto the surface of an OLED light-emitting unit on a substrate, a quantum dot light-emitting layer may be formed through curing. In the process of curing, the solvent in the solution may volatilize, and the remaining quantum dots form an arrangement structure. From interior to exterior, the structure of a quantum dot is roughly divided into three layers, including: an inorganic core, wherein the properties of the inorganic core determines the light emission spectrum of the quantum dot, i.e., the emission of red light, green light, or blue light, and the properties of the inorganic core include the material type of the inorganic core, the size of the inorganic core, etc., for example a CdTe material and the size of the quantum dot formed therefrom; an inorganic shell for protecting and stabilizing the structure of the inorganic core; and an organic ligand, wherein the organic ligand stabilizes and disperses quantum dots in the solution, and after a light-emitting layer is formed by coating, the organic ligand will shrink and cling to the inorganic shell of the quantum dot. With respect to the conductivity of a quantum dot layer, it may be considered that it is comparable to an organic semiconductor film.

A "solution process" or "solution method" mentioned in this specification generally refers to a process or method for preparing a quantum dot solution and coating the solution onto a substrate layer. According to an embodiment of the invention, a water-soluble quantum dot solution (a water-soluble quantum dot material) may be prepared by two methods. In one method, a hydrothermal method is used, that is, a reaction is performed in a direct water system, to generate light-emitting material quantum dots, and the ligand used is typically a water-soluble ligand such as mercaptoacetic acid, etc. In the other method, a hot injection method is used in an organic solvent to generate oil-soluble light-emitting material quantum dots and then water-soluble light-emitting material quantum dots are formed by ligand exchange in which oil-soluble ligands are changed by water-soluble ligands.

In one embodiment, for example, a group such as —COOH, —OH, —NH$_2$, —SO$_3$H, a mercaptoacetic acid group, etc., may be attached to the surface of a CdTe quantum dot by surface modification, and a water-soluble CdTe material can be dissolved in an aqueous solution. With respect to a quantum dot material which is a single component in a water-soluble solution, modifying groups are attached to the surface of the quantum dot and are not present in the solution in the form of ions.

In one embodiment, for example, a group such as —R, —X, —C$_6$H$_5$, TOP/TOPO, an oleic acid group, and an octylamine group, etc., may be attached to the surface of a CdTe quantum dot by surface modification, an oil-soluble CdTe material can be dissolved in an aqueous solution, wherein R represents an alkyl group or an alkenyl group containing 4 to 20 carbon atoms, X represents a halogen, and TOP/TOPO represents trioctyl phosphate/trioctylphosphine oxide. With respect to a quantum dot material which is a single component in an oil-soluble or oily solution, modifying groups are attached to the surface of the quantum dot.

The quantum dot material itself is not a simple substance but a composite material, and for example, may be a core-shell structure, etc. In both of a hydrothermal method and an organic hot injection method, a Cd-containing precursor, for example, and a Te-containing precursor, for example, are subjected to a reaction in an aqueous solution or an organic solution to generate quantum dots of CdTe nanocrystal. A hydrothermal method and an organic hot injection method may form the same product, which is a quantum dot, while the difference is in different ligands on surfaces of quantum dots. A quantum dot may be adjusted to be soluble in water or soluble in an organic solvent (an oily solvent) by the hydrophilicity or the lipophilicity of a ligand. As for a water-soluble CdTe material, a solution comprising quantum dots refers to a solution containing light-emitting material (for example CdTe) quantum dots, wherein the size of the quantum dot is 10-100 nm and a nanoscale film is formed after coating.

In one embodiment, as for a water-soluble light-emitting material, the ligand may be selected from ligands conventionally used in water-soluble light-emitting materials in the art. There is not limit in the invention.

In one embodiment, as for an oil-soluble light-emitting material, the ligand may be selected from ligands conventionally used in oil-soluble light-emitting materials in the art. There is not limit in the invention.

In one embodiment, the aqueous solvent may be selected from water and a mixture of water and a water-miscible organic solvent, wherein the volume content of water in the mixture of water and a water-miscible organic solvent is 10% or more, preferably 20% or more, more preferably 50% or more, and still more preferably 75% or more. Examples of the water-miscible organic solvent may include methanol, ethanol, formic acid, acetic acid, etc.

In one embodiment, the oily solvent may selected from halogenated hydrocarbon solvents, such as trichloromethane, carbon tetrachloride, and dichloroethane; ester solvents, such as ethyl acetate, butyl acetate, pentyl acetate, etc.; hydrocarbon solvents, such as benzene, toluene, xylene, hexane, cyclohexane, etc.; ketone solvents, such as acetone, methyl ethyl ketone, methyl isopropyl ketone, cyclohexanone, etc.; various vegetable oils, such as rapeseed oil, soybean oil, etc.; animal oils, such as beef tallow, etc.; ether solvents, such as ethyl ether, etc.; terpene solvents, such as turpentine, pine oil, etc.; and petroleum solvents, such as gasoline, diesel, mineral spirit, etc.

In one embodiment, the proportion by weight of a water-soluble light-emitting material in an aqueous solvent may be 0.001 to 30%, preferably 0.01 to 25%, and further preferably 0.1 to 10%.

In one embodiment, the proportion by weight of an oil-soluble light-emitting material in an oily solvent may be 0.005 to 25%, preferably 0.01 to 20%, and further preferably 0.1 to 15%.

Coating a quantum dot solution onto a substrate, for example coating a quantum dot solution comprising CdTe onto a substrate, refers to coating a CdTe quantum dot solution onto a substrate by using a technique of spin coating or printing. The film formed is a nanoscale particle film formed through the connection of ligands. Actually, inorganic nanoparticles (i.e., quantum dots) are closely pushed on the surface of the substrate, but fusion between particles will not occur.

In the preparation of a quantum dot layer by a solution method, a solution of light-emitting material quantum dots may be coated on a substrate by spin-coating the solution or a technique of printing to form a thin film of particles having a size on the order of nanometers. The principle is similar to that of forming a polymeric thin film. This method is much simpler than an epitaxial method and has much lower requirement for process conditions, and thus the cost is much lower.

Figure 3:
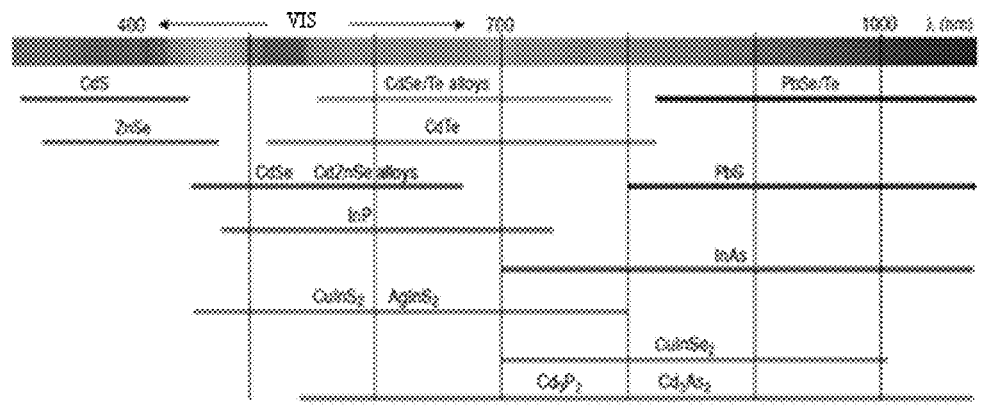
FIG. 3 shows a schematic diagram of light-emitting wavelengths of different bulk materials.

With respect to the relationship between a quantum dot light-emitting material and a corresponding wavelength, FIG. 3 may be referred to. FIG. 3 shows the relationships between different bulk materials and corresponding light-emitting wavelengths. The light-emitting wavelengths corresponding to quantum dot structures of these materials will be relatively reduced. That is so-called "blue shift". A suitable material may be selected and a suitable quantum dot light-emitting layer may be designed, according to practical needs.

The quantum dot light-emitting layer 101 may be a light-emitting layer 101 comprising quantum dots or may be a light-emitting layer 101 comprising particles (microsphere) of a fluorescent material, and materials used for forming these light-emitting layers 101 may be purchased from, for example, Suzhou Xingshuo Nanotech Co., Ltd. (Mesolight) and/or Guangdong Poly OptoElectronics Co., Ltd. (as discussed above). It should be known that solution products may also be purchased from other corporations to form a desirable quantum dot light-emitting layer 101 so as to form a desirable quantum dot light-emitting unit 100P.

In an embodiment of the invention, in the case of a solution which uses an aqueous solvent and is used for forming a quantum dot light-emitting layer 101, the light-emitting material in the aqueous solvent may comprise at least one of the following hydrophilic groups: —COOH, —OH, —NH$_2$, —SO$_3$H, and a mercaptoacetic acid group. In the case of a solution which uses an oily solvent and is used for forming a quantum dot light-emitting layer 101, the light-emitting material in the oily solvent may comprise at least one of the following oleophilic groups: —R, —X, —C$_6$H$_5$, TOP/TOPO, an oleic acid group, and an octylamine group, wherein R represents an alkyl group or an alkenyl group containing 4 to 20 carbon atoms, X represents a halogen such as fluorine, chlorine, bromine, or iodine, and TOP/TOPO represents trioctyl phosphate/trioctylphosphine oxide.

In one embodiment of the invention, a charge generation layer 30 is provided between an OLED light-emitting unit 100O and a quantum dot light-emitting unit 100P or between two quantum dot light-emitting units 100P. For example, as shown in FIG. 1, a charge generation layer 30 may be provided between a blue OLED light-emitting unit 100OB and a green quantum dot light-emitting unit 100PG, and a charge generation layer 30 may be provided between a green quantum dot light-emitting unit 100PG and a red quantum dot light-emitting unit 100PR.

In one embodiment of the invention, the charge generation layer 30 may comprise a layer composed of any one of the following materials: metal oxides, Li or salts thereof, Mg or salts thereof, Cs$_2$CO$_3$, CsN$_3$, CsF, and a bulk material with a p-type/n-type dopant added.

According to an embodiment of the invention, the red quantum dot light-emitting unit comprises a red quantum dot light-emitting layer, wherein the red quantum dot light-emitting layer comprises quantum dots of at least one of the following materials: PbSe/Te, PbS, InAs, CuInSe$_2$, Cd$_3$As$_2$, Cd$_3$P$_2$, CdTe, and AgInS$_2$.

According to an embodiment of the invention, the green quantum dot light-emitting unit comprises a green quantum dot light-emitting layer, wherein the green quantum dot light-emitting layer comprises quantum dots of at least one of the following materials: CdSe/CdZnSe alloy, InP, CuInS$_2$, AgInS$_2$, CdTe, and CdSe/Te alloy.

According to an embodiment of the invention, the blue quantum dot light-emitting unit comprises a blue quantum dot light-emitting layer, wherein the blue quantum dot light-emitting layer comprises quantum dots of at least one of the following materials: CdS and ZnSe.

In one embodiment of the invention, the quantum dot light-emitting layer may have a thickness of 1 to 100 nm.

In one embodiment of the invention, the red quantum dot light-emitting layer may have a thickness of 1 to 100 nm.

In one embodiment of the invention, the green quantum dot light-emitting layer may have a thickness of 1 to 100 nm.

In one embodiment of the invention, the blue quantum dot light-emitting layer may have a thickness of 1 to 100 nm.

According to an embodiment of the invention, the material for forming a hole injection layer 105 may comprise any one in Table 2.

TABLE 2

Materials for forming the hole injection layer

| Abbreviation | CAS No. | Name |
| --- | --- | --- |
| F$_4$TCNQ | 29261-33-4 | Tetrafluorotetracyanoquinodimethane |
| TCNQ | 1518-16-7 | 7,7,8,8-tetracyano-p-quinodimethane |
| HAT-CN | 105598-27-4 | 2,3,6,7,10,11-hexacyano-1,4,5,8,9,12-hexaazatriphenylene |
| 2T-NATA | 185690-41-9 | 4,4',4''-tris(2-naphthylphenylamino)triphenylamine |

According to an embodiment of the invention, the material for forming a hole injection layer may be lithium fluoride.

According to an embodiment of the invention, for example, an aqueous solution may be formed by dissolving a tetrafluorotetracyanoquinodimethane material in water, and a hole injection layer 105 comprising the tetrafluorotetracyanoquinodimethane material may be formed by coating the aqueous solution comprising the tetrafluorotetracyanoquinodimethane onto a substrate comprising a light-emitting layer and performing conventional treatment (e.g., curing, drying, volatilization, etc.) which is well known by a person skilled in the art. In another embodiment, an oily solution may be formed by dissolving a tetrafluorotetracyanoquinodimethane material in an organic solvent, and a hole injection layer (for example, 105) comprising the tetrafluorotetracyanoquinodimethane material may be formed by coating the aqueous solution comprising the tetrafluorotetracyanoquinodimethane onto a substrate comprising a light-emitting layer and performing conventional treatment (e.g., curing, drying, volatilization, etc.) which is well known by a person skilled in the art.

According to an embodiment of the invention, the material for forming a hole transport layer (for example 103) may comprise any one in Table 3.

TABLE 3

Materials for forming the hole transport layer 103

| Abbreviation | CAS No. | Name |
| --- | --- | --- |
| NPB | 123847-85-8 | N,N'-diphenyl-N,N'-(1-naphthyl)-1,1'-biphenyl-4,4'-diamine |
| TPD | 65181-78-4 | N,N'-diphenyl-N,N'-bis(3-methylphenyl)-1,1'-biphenyl-4,4'-diamine |
| TAPC | 58473-78-2 | 4,4'-cyclohexylidenebis[ N,N-bis(4-methylphenyl)aniline] |
| p-TPD | 20441-06-9 | N,N'-diphenyl-N,N'-bis(4-methylphenyl)biphenyl-4,4'-diamine |

According to an embodiment of the invention, the material for forming an electron transport layer (for example 102) may comprise any one in Table 4.

TABLE 4

Materials for forming the electron transport layer 102

| Abbreviation | CAS No. | Name |
| --- | --- | --- |
| BCP | 4733-39-5 | 2,9-dimethyl-4,7-diphenyl-1,10-phenanthroline |
| Bphen | 1662-01-7 | 4,7-diphenyl-1,10-phenanthroline |
| TPBi | 192198-85-9 | 1,3,5-tris(1-phenyl-1H-benzoimidazol-2-yl)benzene |

TABLE 4-continued

Materials for forming the electron transport layer 102

| Abbreviation | CAS No. | Name |
| --- | --- | --- |
| Alq$_3$ | 2085-33-8 | Aluminum tris(8-hydroxyquinolinate) |
| Liq | 850918-68-2 | Lithium 8-hydroxyquinolinate |
| TAZ | 150405-69-9 | 3-(biphenyl-4-yl)-5-(4-tert-butylphenyl)-4-phenyl-4H-1,2,4-triazole |
| Be(PP)$_2$ | 220694-90-6 | Beryllium bis[2-(2-pyridinyl)phenolate] |
| OXD-7 | 138372-67-5 | 2,2'-(1,3-phenyl)bis[5-(4-tert-butylphenyl)-1,3,4-oxadiazole] |
| Balq | 146162-54-1 | Bis(2-methyl-8-quinolinolato-N1,O8)-(1,1'-biphenyl-4-olato)aluminum |
| Be(bq)2 | 148896-39-3 | Bis(10-hydroxybenzo[h]quinolinato)beryllium |
| TpPyPB | 921205-02-9 | 1,3,5-tris(4-pyridin-3-ylphenyl)benzene |

According to an embodiment of the invention, the electron injection layer 104, the electron transport layer 102, the hole transport layer 103, and the hole injection layer 105 may be prepared by using a solution process. The electron injection layer 104, the electron transport layer 102, the hole transport layer 103, and the hole injection layer 105 may are flexible like the light-emitting layer 101, and thus the entire light-emitting apparatus are flexible.

In one embodiment of the invention, one quantum dot light-emitting unit may comprise two types of quantum dot light-emitting layers or several types of quantum dot light-emitting layers. For example, one quantum dot light-emitting unit comprises an electron injection layer and an electron transport layer, and a hole transport layer and a hole injection layer, which are arranged on both sides of a light-emitting layer. The quantum dot light-emitting layer comprises a blue quantum dot light-emitting layer and a red quantum dot light-emitting layer. That is, for example, the light-emitting layer 101 of the light-emitting unit 100II in FIG. 2 comprises a blue quantum dot light-emitting layer 101a and a red quantum dot light-emitting layer 101b. In another embodiment, the light-emitting layer 101 in FIG. 2 further comprises a blue quantum dot light-emitting layer 101a, a red quantum dot light-emitting layer 101b, and a green quantum dot light-emitting layer 101c. In other words, a plurality of quantum dot light-emitting layers are comprised in the same light-emitting unit. Due to this arrangement, the light-emitting unit may generate light having different wavelengths by using fewer layers. In the structure described above, for example, when the blue quantum dot light-emitting layer 101a uses an aqueous solution, the red quantum dot light-emitting layer 101b adjacent to (abutting) the blue quantum dot light-emitting layer 101a preferably uses an oily solution for preparation, and similarly, the green quantum dot light-emitting layer 101c adjacent to (abutting) the red quantum dot light-emitting layer 101b preferably uses an aqueous solution for preparation. Therefore, it is possible to prevent the contamination which may be brought about between different solutions.

According to an embodiment of the invention, similarly to forming a quantum dot light-emitting unit, an OLED may be formed by a solution process or may be formed by an evaporation coating process. In an embodiment of the invention, solutions having different properties may be used in adjacent layers when an OLED light-emitting unit is formed. Verbose words are omitted herein.

Meanwhile, the concept of the invention may be used in the process of forming the entire light-emitting apparatus. That is, when solutions are used to form adjacent layers, solutions having different properties are selected to form adjacent layers, so that in the process of forming adjacent layers, the solution for forming the former layer and the material in the solution will not be dissolved in the latter solution to prevent contamination. For example, an aqueous solution and an oily solution may be alternately used. It should be understood that it is not strictly required to alternately use an aqueous solution and an oily solution to form adjacent layers. For example, solutions for forming an electron injection layer and an electron transport layer may be solutions having the same properties, solutions for forming a hole injection layer and a hole transport layer may be solutions having the same properties.

According to one embodiment of the invention, there is provided a method for forming a light-emitting apparatus, which may form the light-emitting apparatus in above embodiments of the invention. The method for forming a light-emitting apparatus comprises the step of: forming at least one OLED light-emitting unit 100O on a substrate. The method for forming a light-emitting apparatus further comprises the step of: forming at least one quantum dot light-emitting unit 100P on a substrate. The at least one quantum dot light-emitting unit 100P and the at least one OLED light-emitting unit 100O are connected in series. Further, the light-emitting apparatus is flexible. According to an embodiment of the invention, the order of forming the at least one OLED light-emitting unit 100O and the at least one quantum dot light-emitting unit 100P on a substrate may be arbitrary. That is, at least one OLED light-emitting unit 100O may be first formed on a substrate, or at least one quantum dot light-emitting unit 100P may be first formed on a substrate; and then another light-emitting unit is formed on the substrate formed with the light-emitting unit.

According to one embodiment of the invention, the step of forming at least one quantum dot light-emitting unit 100P in the method for forming a light-emitting apparatus comprises: forming at least one quantum dot solution; and coating the at least one quantum dot solution onto the substrate to form at least one quantum dot light-emitting layer 101. The at least one quantum dot light-emitting layer 101 comprises a plurality of close-packed light-emitting material particles or light-emitting quantum dots. According to the invention the method of one embodiment, at least one quantum dot light-emitting layer 101 may be formed by a solution process or an evaporation coating process. According to the invention the method of one embodiment, at least one quantum dot light-emitting unit 100P may be formed by a solution process or an evaporation coating process. According to the invention the method of one embodiment, an OLED light-emitting unit 100O may be formed by a solution process or an evaporation coating process.

According to one embodiment of the invention, solutions for forming two adjacent quantum dot light-emitting layers 101 are solutions which have different properties and are insoluble in each other respectively, so that one material in the solution for forming adjacent layers will not be dissolved in the other solution. Here, the meaning of "adjacent" may include two layers which directly abut each other. However, "adjacent" may include other cases. For example, when two different layers are produced by using a solution process, one or more layers may be formed between these two layers by using an evaporation coating process or another process, and the two layers formed by using a solution process are still two adjacent layers.

According to one embodiment of the invention, as for solutions for forming two adjacent layers in the quantum dot light-emitting unit and the OLED light-emitting unit by a solution process, solutions which have different properties and are insoluble in each other are used respectively.

According to one embodiment of the invention, as for solutions for forming two adjacent quantum dot light-emitting layers 101, an aqueous solvent and an oily solvent are respectively used to form an aqueous solution and an oily solution.

In an embodiment of the invention, solutions for forming two adjacent layers in the quantum dot light-emitting unit and the OLED light-emitting unit by a solution process may use an aqueous solvent and an oily solvent respectively.

According to one embodiment of the invention, the aqueous solution comprises at least one of the following hydrophilic groups: —COOH, —OH, —NH$_2$, —SO$_3$H, and a mercaptoacetic acid group.

According to one embodiment of the invention, the oily solution comprises at least one of the following oleophilic groups: —R, —X, —C$_6$H$_5$, TOP/TOPO, an oleic acid group, and an octylamine group, wherein R represents an alkyl group or an alkenyl group containing 4 to 20 carbon atoms, X represents a halogen, and TOP/TOPO represents trioctyl phosphate/trioctylphosphine oxide.

According to one embodiment of the invention, a charge generation layer 30 is provided between at least one OLED light-emitting unit 100O and at least one quantum dot light-emitting unit 100P.

According to one embodiment of the invention, the light-emitting apparatus comprises a plurality of OLED light-emitting units and a plurality of quantum dot light-emitting units, and a charge generation layer is provided between any two light-emitting units. In other words, a charge generation layer is provided between any two light-emitting units of the at least one OLED light-emitting unit and the at least one quantum dot light-emitting unit.

According to one embodiment of the invention, the charge generation layer 30 comprises a layer composed of any one of the following materials: metal oxides, Li or salts thereof, Mg or salts thereof, Cs$_2$CO$_3$, CsN$_3$, CsF, and a bulk material with a p-type/n-type dopant added.

According to one embodiment of the invention, the at least one quantum dot light-emitting unit 100P comprises any one or more of a red quantum dot light-emitting unit 100PR, a green quantum dot light-emitting unit 100PG, and a blue quantum dot light-emitting unit 100PB.

According to one embodiment of the invention, the step of forming at least one quantum dot light-emitting unit 100P on a substrate further comprises: forming a hole injection layer 105, a quantum dot light-emitting layer 101, and an electron injection layer 104, wherein the hole injection layer 105 and the electron injection layer 104 are arranged on opposite side surfaces of the quantum dot light-emitting layer 101 respectively.

According to one embodiment of the invention, the step of forming at least one quantum dot light-emitting unit 100P on a substrate further comprises: forming a hole transport layer 103 and an electron transport layer 102, wherein the hole transport layer 103 is provided between the hole injection layer 105 and the quantum dot light-emitting layer 101, and the electron transport layer 102 is provided between the electron injection layer 104 and the quantum dot light-emitting layer 101.

According to one embodiment of the invention, the red quantum dot light-emitting unit comprises a red quantum dot light-emitting layer, wherein the red quantum dot light-emitting layer comprises quantum dots of at least one of the following materials: PbSe/Te, PbS, InAs, CuInSe$_2$, Cd$_3$As$_2$, Cd$_3$P$_2$, CdTe, and AgInS$_2$.

According to one embodiment of the invention, the green quantum dot light-emitting unit comprises a green quantum dot light-emitting layer, wherein the green quantum dot light-emitting layer comprises quantum dots of at least one of the following materials: CdSe/CdZnSe alloy, InP, CuInS$_2$, AgInS$_2$, CdTe, and CdSe/Te alloy.

According to one embodiment of the invention, the blue quantum dot light-emitting unit comprises a blue quantum dot light-emitting layer, wherein the blue quantum dot light-emitting layer comprises quantum dots of at least one of the following materials: CdS and ZnSe.

According to one embodiment of the invention, the at least one OLED light-emitting unit 100O comprises a blue OLED light-emitting unit 100OB.

According to one embodiment of the invention, the method for forming a light-emitting apparatus further comprises the step of forming a first electrode 10 and a second electrode 20, wherein the first electrode 10 and the second electrode 20 are arranged on a first surface and a second surface opposite to the first surface of the light-emitting apparatus so as to achieve the electrical connection between the light-emitting apparatus and the exterior.

According to one embodiment of the invention, there is provided a display apparatus, comprising the light-emitting apparatus according to embodiments of the invention. The light-emitting apparatus is used as a back light source of a display apparatus.

EXAMPLES

Comparative Example 1

Figure 4:
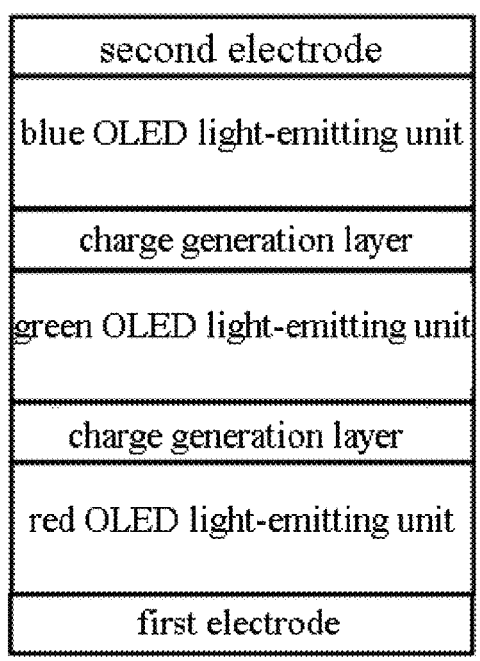
FIG. 4 shows a schematic diagram of a multilayered OLED light-emitting apparatus in the prior art.

Conventional OLED Light-emitting Apparatus Having the Structure Shown in FIG. 4

On a substrate (anode) with a prepared TFTF array, printing and curing of respective layers of HIL 30 nm, HTL 200 nm, R-OLED 30 nm, ETL 30 nm, CGL 30 nm, HTL 30 nm, G-OLED 30 nm, ETL 30 nm, CGL 30 nm, HTL 30 nm, B-OLED 30 nm, and ETL 30 nm were accomplished respectively by sequentially using an IJP technique, and a Mg/Ag cathode total-reflection electrode 150 nm was evaporation coated.

Example 1

Inventive apparatus (similar to the structure shown in FIG. 4, wherein red and green OLEDs were replaced by red and green quantum dot light-emitting units respectively)

On a substrate (anode) with a prepared TFTF array, printing and curing of respective layers of HIL 30 nm, HTL 200 nm, R-QDL 30 nm, ETL 30 nm, CGL 30 nm, HTL 30 nm, G-QDL 30 nm, ETL 30 nm, CGL 30 nm, HTL 30 nm, B-OLED 30 nm, and ETL 30 nm were accomplished respectively by sequentially using an IJP technique, and a Mg/Ag cathode total-reflection electrode 150 nm was evaporation coated.

Compared to the conventional OLED light-emitting apparatus having the structure shown in FIG. 4, the saturation of the emergent light of the light-emitting apparatus of the invention was increased by at least 5% or more.

In Example 1 and Comparative Example 1:
HIL: hole injection layer, which uses tetrafluorotetracyanoquinodimethane HTL: hole transport layer, which uses N,N'-diphenyl-N, N'-(1-naphthyl)-1,1'-biphenyl-4,4'-diamine.

R-QDL: red quantum dot layer, which uses PbSe/Te

ETL: electron transport layer, which uses 2,9-dimethyl-4,7-diphenyl-1,10-phenanthroline.

CGL: charge generation layer, which uses $Cs_2CO_3$

G-QDL: green quantum dot layer, which uses CdSe/CdZnSe alloy

B-OLED: blue organic light-emitting layer, which uses 9,9'-(1,3-phenyl)bis-9H-carbazole.

R-OLED: R-OLED: red organic light-emitting layer, which uses TPBD

G-OLED: green organic light-emitting layer, which uses a coumarin dye (Coumarin 6)

Although the invention has been specifically illustrated and described with reference to typical embodiments of the invention, it should be understood by those of ordinary skill in the art that various modifications may be made to these embodiments in form and details without departing from the spirit and scope of the invention as defined by the appended claims.

What is claimed is:

1. A method for forming a light-emitting apparatus, comprising the steps of:
    forming at least one OLED light-emitting unit on a substrate; and
    forming at least one quantum dot light-emitting unit on the at least one OLED light-emitting unit;
    or
    forming at least one quantum dot light-emitting unit on a substrate; and
    forming at least one OLED light-emitting unit on the at least one quantum dot light-emitting unit;
    wherein the at least one quantum dot light-emitting unit and the at least one OLED light-emitting unit are connected in series,
    wherein the step of forming at least one quantum dot light-emitting unit comprises a step of forming at least one quantum dot light-emitting layer, and at least one of the at least one quantum dot light-emitting unit comprises two or more adjacent quantum dot light-emitting layers;
    wherein the step of forming at least one quantum dot light-emitting unit comprises:
        forming at least one quantum dot solution; and
        forming the at least one quantum dot light-emitting layer after the at least one quantum dot solution is coated and cured; and
    wherein solutions for forming two adjacent layers in the quantum dot light-emitting unit and the OLED light-emitting unit by a solution process are solutions which are insoluble in each other, use an aqueous solvent and an oily solvent respectively, to form a solution of a light-emitting material in the aqueous solvent or a solution of a light-emitting material in the oily solvent.

2. The method according to claim 1, wherein the quantum dot light-emitting layer has a thickness of 1 to 100 nm.

3. The method according to claim 1, wherein the at least one quantum dot light-emitting layer comprises a close-packed structure of a plurality of quantum dots.

4. The method according to claim 1, wherein the light-emitting material in the aqueous solvent comprises at least one of the following hydrophilic groups: —COOH, —OH, —$NH_2$, —$SO_3H$, and a mercaptoacetic acid group, the light-emitting material in the oily solvent comprises at least one of the following oleophilic groups: —R, —X, —$C_6H_5$, TOP/TOPO, an oleic acid group, and an octylamine group, wherein R represents an alkyl group or an alkenyl group containing 4 to 20 carbon atoms, X represents a halogen, and TOP/TOPO represents trioctyl phosphate/trioctylphosphine oxide.

5. The method according to claim 1, wherein a charge generation layer is provided between any two light-emitting units of the at least one OLED light-emitting unit and the at least one quantum dot light-emitting unit.

6. The method according to claim 5, wherein the charge generation layer comprises a layer composed of any one of the following materials: metal oxides, Li or salts thereof, Mg or salts thereof, $Cs_2CO_3$, $CsN_3$, CsF, and a bulk material with a p-type/n-type dopant added.

7. The method according to claim 1, wherein the at least one quantum dot light-emitting unit comprises a red quantum dot light-emitting unit, wherein the red quantum dot light-emitting unit comprises a red quantum dot light-emitting layer, wherein the red quantum dot light-emitting layer comprises quantum dots of at least one of the following materials: PbSe/Te, PbS, InAs, $CuInSe_2$, $Cd_3As_2$, $Cd_3P_2$, CdTe, and $AgInS_2$, wherein the red quantum dot light-emitting layer has a thickness of 1 to 100 nm.

8. The method according to claim 1, wherein the at least one quantum dot light-emitting unit comprises a green quantum dot light-emitting unit, wherein the green quantum dot light-emitting unit comprises a green quantum dot light-emitting layer, wherein the green quantum dot light-emitting layer comprises quantum dots of at least one of the following materials: CdSe/CdZnSe alloy, InP, $CuInS_2$, $AgInS_2$, CdTe, and CdSe/Te alloy, wherein the green quantum dot light-emitting layer has a thickness of 1 to 100 nm.

9. The method according to claim 1, wherein the at least one quantum dot light-emitting unit comprises a blue quantum dot light-emitting unit, wherein the blue quantum dot light-emitting unit comprises a blue quantum dot light-emitting layer, wherein the blue quantum dot light-emitting layer comprises quantum dots of at least one of the following materials:
    CdS and ZnSe, wherein the blue quantum dot light-emitting layer has a thickness of 1 to 100 nm.

* * * * *